United States Patent
He (10) Patent No.: US 11,563,061 B2
(45) Date of Patent: Jan. 24, 2023

(54) OLED ARRAY SUBSTRATE, MANUFACTURING METHOD THEREOF AND TOUCH DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventor: Jian He, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 1095 days.

(21) Appl. No.: 16/069,793

(22) PCT Filed: Jan. 5, 2018

(86) PCT No.: PCT/CN2018/071530
§ 371 (c)(1),
(2) Date: Jul. 12, 2018

(87) PCT Pub. No.: WO2018/205661
PCT Pub. Date: Nov. 15, 2018

(65) Prior Publication Data
US 2021/0327965 A1    Oct. 21, 2021

(30) Foreign Application Priority Data
May 12, 2017 (CN) .......................... 201710342458.9

(51) Int. Cl.
*H01L 27/32*  (2006.01)
*G06F 3/041*  (2006.01)
(Continued)

(52) U.S. Cl.
CPC .......... *H01L 27/323* (2013.01); *G06F 3/0412* (2013.01); *H01L 27/3246* (2013.01);
(Continued)

(58) Field of Classification Search
CPC ......... G06F 2203/04103; G06F 3/0412; H01L 27/323; H01L 27/3246; H01L 51/5237; H01L 51/56
(Continued)

(56) References Cited

U.S. PATENT DOCUMENTS 9,336,723 B2    5/2016  Gupta et al.
2013/0181925 A1*  7/2013  Kim ................... G06F 3/04164
                                                     345/173
(Continued)

FOREIGN PATENT DOCUMENTS

CN    103984442 A    8/2014
CN    104166475 A    11/2014
(Continued)

OTHER PUBLICATIONS

Search Report and Written Opinion for International Application No. PCT/CN2018/071530 dated Apr. 9, 2018.

*Primary Examiner* — Chun-Nan Lin
(74) *Attorney, Agent, or Firm* — Calfee, Halter & Griswold LLP (57) ABSTRACT

An OLED array substrate, a manufacturing method thereof and a touch display device. The OLED array substrate includes a base substrate, a transistor on the base substrate, and a planarization layer covering the transistor. The OLED array substrate further includes a touch sensor integrated in the OLED array substrate, wherein the touch sensor is located on a side of the planarization layer facing away from
(Continued)

the transistor, and the touch sensor includes first touch electrodes and second touch electrodes insulated from each other.

9 Claims, 7 Drawing Sheets

(51) Int. Cl.
*H01L 51/52* (2006.01)
*H01L 51/56* (2006.01)

(52) U.S. Cl.
CPC .......... *H01L 51/5237* (2013.01); *H01L 51/56* (2013.01); *G06F 2203/04103* (2013.01)

(58) Field of Classification Search
USPC .................................................. 345/170–178
See application file for complete search history.

(56) References Cited

U.S. PATENT DOCUMENTS

| | | | |
|---|---|---|---|
| 2014/0036167 A1* | 2/2014 | Chi ....................... | G06F 1/1692 349/12 |
| 2014/0225838 A1 | 8/2014 | Gupta et al. | |
| 2015/0041778 A1 | 2/2015 | Chang et al. | |
| 2015/0268761 A1* | 9/2015 | Yang .................... | G06F 3/0446 345/174 |
| 2016/0246422 A1 | 8/2016 | Tan et al. | |
| 2016/0274693 A1 | 9/2016 | Liu | |
| 2016/0306479 A1 | 10/2016 | Zhu et al. | |
| 2016/0322429 A1* | 11/2016 | Chen, Jr. .............. | G06F 3/0445 |
| 2018/0046298 A1* | 2/2018 | Weng ................. | G02F 1/134336 |
| 2018/0158875 A1 | 6/2018 | Dong et al. | |
| 2019/0012022 A1* | 1/2019 | Ye ........................ | G06F 3/04164 |
| 2019/0025969 A1* | 1/2019 | Liu ....................... | G09G 3/3611 |
| 2019/0095020 A1* | 3/2019 | Wu ....................... | G02B 5/3025 |
| 2019/0296098 A1* | 9/2019 | Cheng .................... | H01L 33/44 |
| 2020/0052005 A1* | 2/2020 | Yoshida .............. | H01L 21/3205 |
| 2020/0064969 A1* | 2/2020 | Gao ....................... | G06F 3/0445 |
| 2020/0194505 A1* | 6/2020 | Tang ................... | H01L 51/5225 |
| 2020/0285281 A1* | 9/2020 | Li ............................ | H01L 27/32 |
| 2020/0350268 A1* | 11/2020 | Chu ........................ | H01L 24/45 |
| 2021/0048908 A1* | 2/2021 | Dai .................... | G02F 1/133514 |
| 2021/0064212 A1* | 3/2021 | Huang ................ | G06F 3/04166 |
| 2021/0096695 A1* | 4/2021 | Zhang .................... | G06F 3/0448 |
| 2021/0210559 A1* | 7/2021 | Chen ....................... | H01L 51/56 |
| 2021/0225945 A1* | 7/2021 | Li .......................... | H01L 27/323 |
| 2021/0242163 A1* | 8/2021 | Sauerland .............. | H01L 24/85 |

FOREIGN PATENT DOCUMENTS

| | | |
|---|---|---|
| CN | 104966790 A | 10/2015 |
| CN | 104981908 A | 10/2015 |
| CN | 105446554 A | 3/2016 |
| CN | 106033765 A | 10/2016 |
| CN | 106158909 A | 11/2016 |
| CN | 106654067 A | 5/2017 |
| CN | 107092399 A | 8/2017 |
| WO | 2015085900 A1 | 6/2015 |
| WO | 2016155354 A1 | 10/2016 |

* cited by examiner

OLED ARRAY SUBSTRATE, MANUFACTURING METHOD THEREOF AND TOUCH DISPLAY DEVICE

The present application is the U.S. national phase entry of PCT/CN2018/071530 filed on Jan. 5, 2018, which claims the priority of Chinese patent application No. 201710342458.9 filed on May 12, 2017, the entire disclosures of which are incorporated herein by reference.

TECHNICAL FIELD

The present disclosure relates to the field of display technologies, and in particular to an OLED array substrate, a manufacturing method thereof and a touch display device.

BACKGROUND ART

Active Matrix Organic Light Emitting Diode (AMOLEDs) displays have advantages such as low manufacture costs, a fast response speed, low power consumption, a wide range of operation temperatures and adaptiveness to DC driving of a portable device, and hence are expected to be the next generation of new type displays replacing liquid crystal displays (LCDs). In particular, flexible AMOLEDs are attracting more and more attention on the market, as they are light and thin, bendable or collapsible, and arbitrarily variable in shape.

A typical AMOLED usually needs an encapsulation cover plate as a barrier to water and oxygen. The encapsulation cover plate can be a glass cover plate. In this case, when a touch structure is integrated in the AMOLED, the touch structure can be arranged on an outer surface of the glass cover plate by an On Cell process. However, for a flexible AMOLED, a Thin Film Encapsulation (TFE) process is usually used. Since the TFE process adopts an encapsulation thin film layer with a soft texture, on which the touch structure cannot be integrated by the On Cell process, the applicable range of flexible AMOLEDs is reduced.

SUMMARY

Embodiments of the present disclosure provide an OLED (Organic Light Emitting Diode) array substrate, a manufacturing method thereof and a touch display device, which are capable of at least partly alleviating or eliminating one or more of the above problems.

According to one embodiment of the present disclosure, an OLED array substrate is provided, comprising: a base substrate; a transistor on the base substrate; a planarization layer covering the transistor; and a touch sensor integrated in the OLED array substrate, wherein the touch sensor is located on a side of the planarization layer facing away from the transistor, and comprises first touch electrodes and second touch electrodes insulated from each other.

According to some embodiments, the first touch electrodes and the second touch electrodes are located in different layers, the touch sensor further comprising a dielectric layer between the first touch electrodes and the second touch electrodes, via which the first touch electrodes and the second touch electrodes are insulated from each other.

According to some embodiments, the first touch electrodes are strip electrodes extending in a first direction, and the second touch electrodes are strip electrodes extending in a second direction, the first direction being perpendicular to the second direction.

According to some embodiments, the touch sensor further comprises a dielectric layer, via which the first touch electrodes and the second touch electrodes are insulated from each other, wherein the first touch electrodes are strip electrodes extending in a first direction, and the second touch electrodes comprise block electrodes arranged in a matrix between the strip electrodes, and bonding wires electrically connected with adjacent block electrodes in a second direction, the first direction being perpendicular to the second direction, and wherein the first touch electrodes and the block electrodes are located in a same layer, and the bonding wires are located in a different layer from the first touch electrodes and the block electrodes.

According to some embodiments, sides of the first touch electrodes extending in the first direction on an upper surface of the first touch electrodes facing away from the base substrate are inwardly recessed, outwardly protruding or in a shape of sawteeth, and/or, sides of the second touch electrodes extending in the second direction on an upper surface of the second touch electrodes facing away from the base substrate are inwardly recessed, outwardly protruding or in a shape of sawteeth.

According to some embodiments, sides of the first touch electrodes extending in the first direction on an upper surface of the first touch electrodes facing away from the base substrate are inwardly recessed, outwardly protruding or in a shape of sawteeth, and/or, sides of the block electrodes extending in the second direction on an upper surface of the block electrodes facing away from the base substrate are inwardly recessed, outwardly protruding or in a shape of sawteeth.

According to some embodiments, the OLED array substrate further comprises a pixel definition layer on a side of the planarization layer facing away from the transistor. The touch sensor is located between the pixel definition layer and the planarization layer, and an orthogonal projection of the touch sensor on the base substrate overlaps an orthogonal projection of the pixel definition layer on the base substrate.

According to some embodiments, the OLED array substrate further comprises an anode on a side of the planarization layer facing away from the transistor. The first touch electrodes or the second touch electrodes are arranged in a same layer and made of a same material as the anode.

According to some embodiments, the OLED array substrate further comprises an anode on a side of the planarization layer facing away from the transistor. The first touch electrodes and the second touch electrodes are arranged in a same layer and made of a same material as the anode.

According to some embodiments, the OLED array substrate further comprises an anode on a side of the planarization layer facing away from the transistor. The bonding wires are arranged in a same layer and made of a same material as the anode.

According to some embodiments, the OLED array substrate further comprises a pixel definition layer on a side of the planarization layer facing away from the transistor, wherein the pixel definition layer comprises first portions extending in a first direction and second portions extending in a second direction, the first portions and the second portions enclosing a plurality of openings. The touch sensor is located between the pixel definition layer and the planarization layer. Orthogonal projections of the first touch electrodes on the base substrate overlap orthogonal projections of the first portions on the base substrate, and orthogonal projections of the second touch electrodes on the base substrate overlap orthogonal projections of the second portions on the base substrate, the first direction being perpendicular to the second direction.

According to some embodiments, the OLED array substrate further comprises a pixel definition layer on a side of the planarization layer facing away from the transistor, wherein the pixel definition layer comprises first portions extending in a first direction and second portions extending in a second direction, the first portions and the second portions enclosing a plurality of openings. The touch sensor is located between the pixel definition layer and the planarization layer. Orthogonal projections of the bonding wires on the base substrate overlap orthogonal projections of the second portions on the base substrate, the first direction being perpendicular to the second direction.

According to another embodiment of the present disclosure, a touch display device is provided, comprising any OLED array substrate as mentioned above.

According to some embodiments, the touch display device further comprises a flexible encapsulation layer for encapsulating the OLED array substrate.

According to yet another embodiment of the present disclosure, a method for manufacturing an OLED array substrate is provided, comprising: forming a transistor on a base substrate; forming a planarization layer covering the transistor on the base substrate on which the transistor has been formed; forming first touch electrodes and second touch electrodes insulated from each other on the base substrate on which the planarization layer has been formed. The first touch electrodes and the second touch electrodes constitute a touch sensor.

According to some embodiments, forming first touch electrodes and second touch electrodes insulated from each other comprises: depositing a first conductive material layer on the base substrate on which the planarization layer has been formed and forming by one patterning process an anode and strip-shaped first touch electrodes; forming a dielectric layer on the base substrate on which the first touch electrodes have been formed; depositing a second conductive material layer on the base substrate on which the dielectric layer has been formed and forming by a patterning process strip-shaped second touch electrodes intersecting the first touch electrodes.

According to some embodiments, forming first touch electrodes and second touch electrodes insulated from each other comprises: depositing a first conductive material layer on the base substrate on which the planarization layer has been formed and forming strip-shaped first touch electrodes by a patterning process; forming a dielectric layer on the base substrate on which the first touch electrodes have been formed; depositing a second conductive material layer on the base substrate on which the dielectric layer has been formed and forming by one patterning process an anode and strip-shaped second touch electrodes intersecting the first touch electrodes.

According to some embodiments, forming first touch electrodes and second touch electrodes insulated from each other comprises: depositing a first conductive material layer on the base substrate on which the planarization layer has been formed and forming by one patterning process strip-shaped first touch electrodes, block electrodes arranged in a matrix between the strip-shaped first touch electrodes as well as an anode, wherein the first touch electrodes extend in a first direction; forming a dielectric layer on the base substrate on which the first touch electrodes, the block electrodes and the anode has been formed and forming via holes in positions of the dielectric layer corresponding to the block electrodes; depositing a second conductive material layer on the base substrate on which the dielectric layer has been formed and forming bonding wires by a patterning process, wherein the bonding wires are electrically connected with the block electrodes in a second direction through the via holes, wherein the first direction is perpendicular to the second direction, and wherein the bonding wires and the block electrodes constitute second touch electrodes.

According to some embodiments, forming first touch electrodes and second touch electrodes insulated from each other comprises: depositing a first conductive material layer on the base substrate on which the planarization layer has been formed and forming by one patterning process strip-shaped first touch electrodes and block electrodes arranged in a matrix between the strip-shaped first touch electrodes, wherein the first touch electrodes extend in a first direction; forming a dielectric layer on the base substrate on which the first touch electrodes and the block electrodes have been formed and forming via holes in positions of the dielectric layer corresponding to the block electrodes; depositing a second conductive material layer on the base substrate on which the dielectric layer has been formed and forming by one patterning process bonding wires and an anode, wherein the bonding wires are electrically connected with the block electrodes in a second direction through the via holes, wherein the first direction is perpendicular to the second direction, and wherein the bonding wires and the block electrodes constitute second touch electrodes.

According to some embodiments, after forming first touch electrodes and second touch electrodes insulated from each other, the method further comprises: forming a pixel definition layer on the base substrate on which the touch sensor has been formed. An orthogonal projection of the touch sensor on the base substrate overlaps an orthogonal projection of the pixel definition layer on the base substrate.

The present disclosure provides an OLED array substrate, a manufacturing method thereof and a touch display device. The OLED array substrate comprises: a base substrate, a transistor on the base substrate and a planarization layer covering the transistor. The OLED array substrate further comprises a touch sensor integrated in the OLED array substrate. The touch sensor is located on a side of the planarization layer facing away from the transistor, and comprises first touch electrodes and second touch electrodes insulated from each other. In the OLED array substrate as provided by embodiments of the present disclosure, the touch sensor is manufactured on a side of the planarization layer of the OLED array substrate facing away from the transistor. I.e., the touch sensor is integrated on the OLED array substrate by an In-Cell process, and thereby a touch AMOLED is provided. In this way, when the touch AMOLED is a flexible display device, the touch integration process will not be influenced by any TFE process of the touch AMOLED, which improves the applicable range of flexible AMOLEDs.

BRIEF DESCRIPTION OF DRAWINGS

In order to illustrate technical solutions in embodiments of the present disclosure more clearly, drawings to be used in depictions of embodiments of the present disclosure will be briefly introduced below. Apparently, the drawings in the depictions below are only some embodiments of the present disclosure. For a person having ordinary skills in the art, other drawings can be further obtained from these drawings without any inventive efforts.

DETAILED DESCRIPTION OF EMBODIMENTS

Technical solutions in embodiments of the present disclosure shall be described clearly and completely as follows with reference to the drawings in embodiments of the present disclosure. Obviously, the described embodiments are only part of embodiments of the present disclosure, instead of all. Based on embodiments in the present disclosure, all other embodiments obtainable by a person having ordinary skills in the art without any inventive efforts shall fall within the protection scope of the present disclosure.

The following reference signs will be used in the drawings:

01—OLED array substrate; 101—base substrate; 102—display sub-pixel; 103—touch sub-pixel; 11—planarization layer; 20—touch sensor; 201—first touch electrode; 202—second touch electrode; 21—dielectric layer; 22—bonding wire; 110—anode; 120—organic material function layer; 121—cathode; 122—polarizer; 123—thin film encapsulation layer; 30—pixel definition layer; 3011—first portion; 3012—second portion; 302—opening; A—display region; and B—non-display region.

Figure 1:
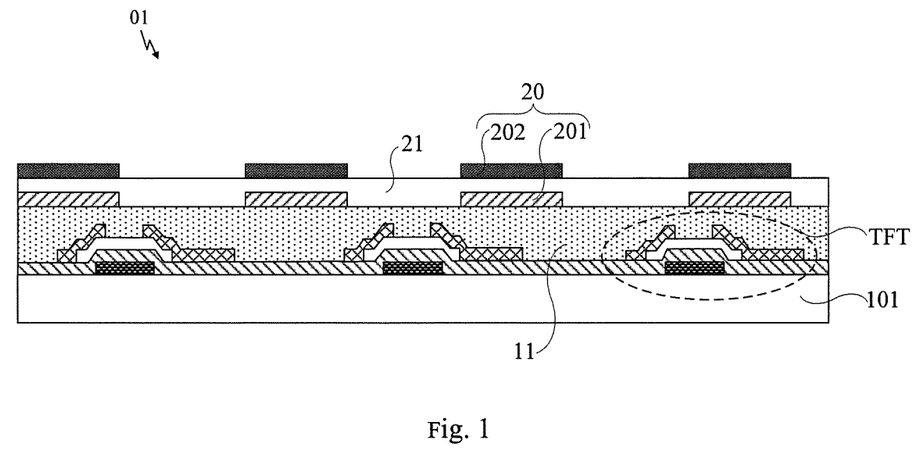
FIG. 1 schematically illustrates a section view of an OLED array substrate provided by an embodiment of the present disclosure.

Embodiments of the present disclosure provide an OLED array substrate 01, as shown in FIG. 1, comprising: a base substrate 101, a transistor (e.g., a thin film transistor, a "TFT") on the base substrate 101, and a planarization layer 11 covering the transistor.

Based on that, the OLED array substrate 01 further comprises a touch sensor 20 integrated in the OLED array substrate 01 and located on a side of the planarization layer 11 facing away from the TFT. The touch sensor 20 comprises first touch electrodes 201 and second touch electrodes 202 insulated from each other.

It should be noted that the first touch electrodes 201 and the second touch electrodes 202 insulated from each other mean that the first touch electrodes 201 and the second touch electrodes 202 are arranged in different layers, as shown in FIG. 1. The touch sensor 20 further comprises a dielectric layer 21 arranged between the first touch electrodes 201 and the second touch electrodes 202. The dielectric layer 21 has an insulating function. Materials for forming the dielectric layer 21 can comprise but are not limited to SiOx, SiNx, AlOx, SiOxNy and an organic insulating material, or a composite material consisting of at least two of the above materials.

Figure 2:
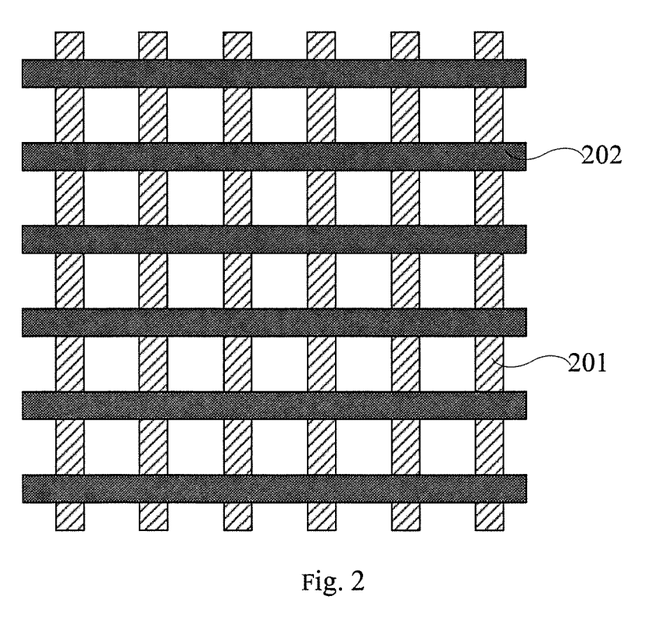
FIG. 2 schematically illustrates a top view of an arrangement of first touch electrodes and second touch electrodes in FIG. 1.

When the first touch electrodes 201 and the second touch electrodes 202 are arranged in different layers, the first touch electrodes 201 and the second touch electrodes 202 can be both strip-shaped, as shown in FIG. 2, and intersect each other. In order to facilitate wiring, in some exemplary embodiments, the strip-shaped first touch electrodes 201 and second touch electrodes 202 can be perpendicular to each other. In other words, the first touch electrodes 201 and the second touch electrodes 202 are arranged in a matrix in FIG. 2.

In the matrix arrangement as shown in FIG. 2, each crossing region of the first touch electrodes 201 and the second touch electrodes 202 defines a touch unit, wherein the first touch electrodes 201 define longitudinal coordinates of touch sub-pixels, and the second touch electrodes 202 define transversal coordinates of touch sub-pixels. By adjusting sizes of the first touch electrodes 201, intervals between the first touch electrodes 201, sizes of the second touch electrodes 202, and intervals between the second touch electrodes 202 suitably, the touch accuracy of the OLED display device can be set upon needs.

Figure 3:
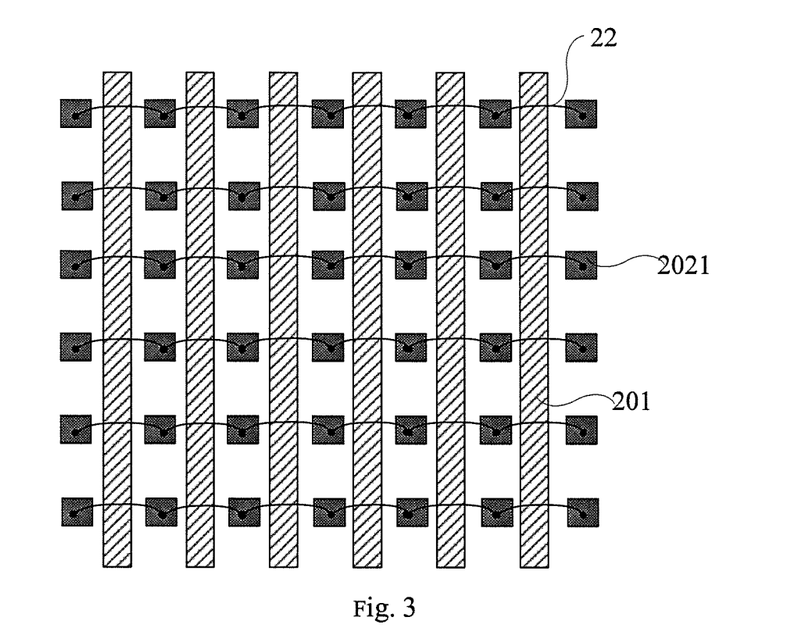
FIG. 3 schematically illustrates a top view of another arrangement of first touch electrodes and second touch electrodes in FIG. 1.

Alternatively, as shown in FIG. 3, the first touch electrodes 201 are strip electrodes extending in a longitudinal direction, while the second touch electrodes comprise block electrodes 2021 arranged in a matrix between the strip electrodes, and bonding wires 22 electrically connected with adjacent block electrodes 2021 in a transversal direction. The first touch electrodes 201 are located in a same layer as the block electrodes 2021, and the bonding wires 22 are located in a different layer from the first touch electrodes 201 and the block electrodes 2021. The touch sensor 20 further comprises a dielectric layer. The first touch electrodes 201 and the second touch electrodes 202 are insulated from each other via the dielectric layer. For example, the dielectric layer can be an insulating material filling gaps between the first touch electrodes 201 and the second touch electrodes 202, for example, SiOx, SiNx, AlOx, SiOxNy and an organic insulating material, or a composite material consisting of at least two of the above materials. In other words, the first touch electrodes 201 and the second touch electrodes 202 are arranged in the form of bridge in FIG. 3.

In the bridge arrangement as shown in FIG. 3, each crossing region of the first touch electrodes 201 and the second touch electrodes 201 defines a touch unit, wherein the first touch electrodes 201 correspond to longitudinal coordinates of touch sub-pixels, and the bonding wires 22 correspond to transversal coordinates of touch sub-pixels. By adjusting sizes of the first touch electrodes 201, intervals between the first touch electrodes 201, sizes of the second touch electrodes 202, and intervals between the second touch electrodes 202 suitably, the touch accuracy of the OLED display device can be set upon needs.

Figure 4A:
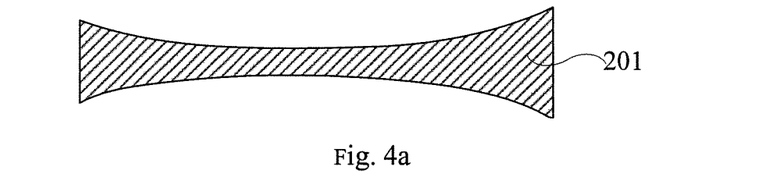
FIG. 4a is a schematic view showing a side surface shape of the first touch electrodes in FIG. 3.
Figure 4B:
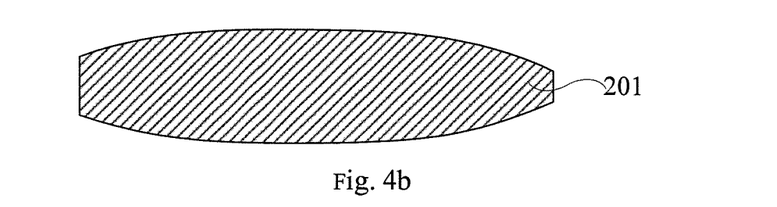
FIG. 4b is a schematic view showing another side surface shape of the first touch electrodes in FIG. 3.
Figure 4C:
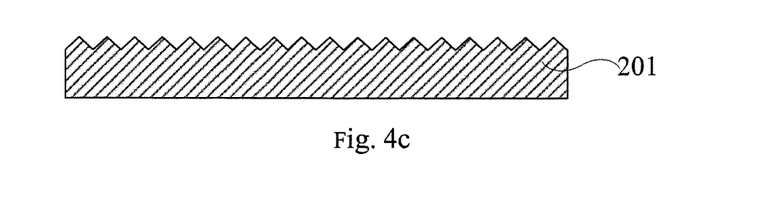
FIG. 4c is a schematic view showing yet another side surface shape of the first touch electrodes in FIG. 3.

Shape of an upper surface of the strip-shaped first touch electrodes 201 or second touch electrodes 202 facing away from the base substrate is not limited in the present disclosure. For example, in the arrangement as shown in FIG. 2, sides of the first touch electrodes 201 extending in the longitudinal direction on an upper surface of the first touch electrodes facing away from the base substrate can be inwardly recessed (as shown in FIG. 4A), outwardly protruding (as shown in FIG. 4B) or in a shape of sawteeth (as shown in FIG. 4C). Similarly, sides of the second touch electrodes 202 extending in the transversal direction on an upper surface of the second touch electrodes 202 facing away from the base substrate can be inwardly recessed, outwardly protruding or in a shape of sawteeth.

Alternatively, in the arrangement as shown in FIG. 3, sides of the first touch electrodes 201 extending in the longitudinal direction on an upper surface of the first touch electrodes 201 facing away from the base substrate can be inwardly recessed, outwardly protruding or in a shape of sawteeth. Similarly, sides of the block electrodes 2021 extending in the transversal direction on an upper surface of the block electrodes 2021 facing away from the base substrate can be inwardly recessed, outwardly protruding or in a shape of sawteeth. Curvature of any of the above curves is not limited in the present disclosure, which can be adjusted by those skilled in the art upon needs.

By altering the shape of the upper surface of the first touch electrodes and/or the second touch electrodes facing away from the base substrate, visibility of the touch sensor can be reduced, thereby preventing a user from seeing the touch sensor on the OLED display device and avoiding influences on the display effect. In the meanwhile, the arrangement of the touch sensor can be further adapted to the available space in the OLED array substrate, thereby promoting integration of the touch sensor in the OLED array substrate.

Based on that, the OLED array substrate 01 has a plurality of sub-pixels arranged in a matrix, each sub-pixel being provided with a pixel circuit which consists of a TFT and a capacitor. The pixel circuit can drive a lighting device (e.g., an OLED device) in each sub-pixel to emit light.

It should be noted that TFT can be any of amorphous silicon TFTs, low-temperature polycrystalline silicon TFTs, oxide TFTs and organic TFTs. Moreover, TFTs in the OLED array substrate can be all of a same type, or the OLED array substrate can comprise at least two different types of TFTs.

Besides, when the OLED array substrate 01 is used for manufacturing a flexible AMOLED display, the base substrate 101 is made of a flexible material (e.g., a flexible transparent resin material).

Figure 5:
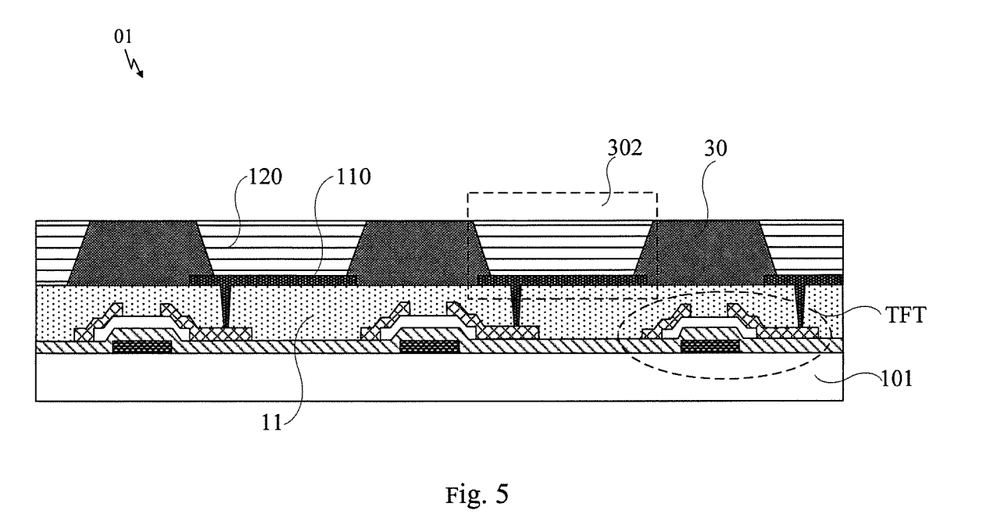
FIG. 5 schematically illustrates a section view of an OLED array substrate comprising a pixel definition layer provided by an embodiment of the present disclosure.

Furthermore, as shown in FIG. 5, the OLED array substrate 01 further comprises a pixel definition layer 30 on a side of the planarization layer 11 facing away from the TFTs. The pixel definition layer 30 comprises first portions 3011 extending in a longitudinal direction and second portions 3012 extending in a transversal direction, the first portions 3011 and the second portions 3012 enclosing a plurality of openings 302 (as shown in FIG. 7b). The touch sensor 20 is located between the pixel definition layer 30 and the planarization layer 11. Each of the openings 302 is provided with an OLED device. As shown in FIG. 5, the TFT located on the base substrate 101 is used for driving the OLED device to emit light, wherein a source or a drain of the driving transistor is connected with an anode 110 of the OLED device.

As shown in FIG. 5, the OLED device further comprises an organic material function layer 120 located on the anode 110. The organic material function layer 120 can comprise a hole injection layer, a hole transport layer, an organic light emitting layer, an electron transport layer and an electron injection layer. In order to improve the utilization of light emitted by the organic light emitting layer, a planarization layer 11 can be provided on the TFT, so as to provide a flat surface for the anode 110 of the OLED device. In this way, light emitted downwards from the organic light emitting layer can be reflected specularly, thereby reducing leakage of light from a side of the base substrate 101 and improving the utilization of light.

In the OLED array substrate 01 provided by embodiments of the present disclosure, the touch sensor 20 is manufactured on a side of the planarization layer 11 of the OLED array substrate 01 facing away from the transistor TFT. I.e., the touch sensor 20 is integrated on the OLED array substrate 01 by an In-Cell process, and thereby a touch AMOLED is provided. In this way, when the touch AMOLED is a flexible display device, the touch integration process will not be influenced by any TFE process of the touch AMOLED, which improves the applicable range of flexible AMOLEDs.

Figure 6:
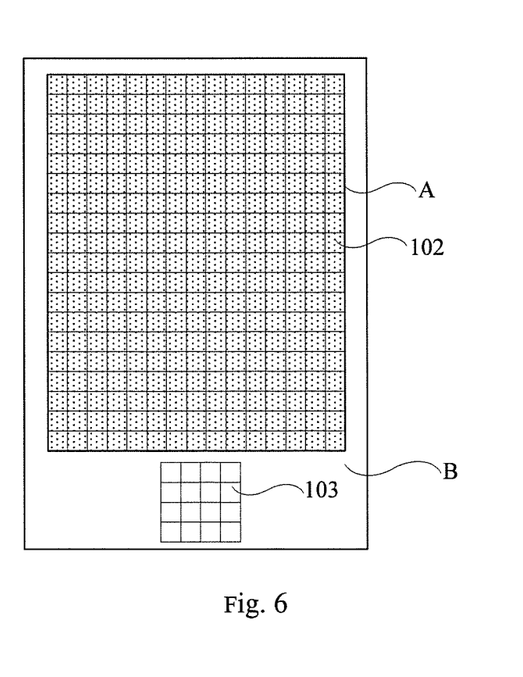
FIG. 6 schematically illustrates a top view of a display region and a non-display region of a display device provided by an embodiment of the present disclosure.

Correspondingly, embodiments of the present disclosure provide a display device. As shown in FIG. 6, the display device comprises a display region A and a non-display region B on periphery of the display region A. The position of the touch sensor 20 is not limited in embodiments of the present disclosure. For example, as shown in FIG. 6, the touch sensor 20 is arranged in the non-display region B.

A plurality of display sub-pixels 102 are arranged in a matrix in the display region A of the display device. A touch member of the display device comprises a plurality of touch sub-pixels 103 arranged in a matrix, each touch sub-pixels 103 being provided with one touch sensor 20. In this case, when each of the touch sensors 20 is arranged in the non-display region B, the display sub-pixels 102 do not overlap the touch sub-pixels 103.

However, with the increasing development of touch technologies, the user performs touch operations in the display region A more and more frequently. So, arranging the touch sensor 20 in the display region A has become a trend of development for touch display devices in the future. In this case, the display sub-pixels 102 overlap the touch sub-pixels 103 partly. The size of the overlapping region is not limited in the present disclosure. For example, the display sub-pixels 102 can overlap the touch sub-pixels 103 in a ratio of 1:1. I.e., one touch sub-pixel 103 corresponds to one display sub-pixel 102. Alternatively, one touch sub-pixel 103 can correspond to a plurality of display sub-pixels 102. This is not limited in the present disclosure.

Based on that, in a case where the touch sensor 20 is arranged in the display region A, the touch sensor can be arranged such that an orthogonal projection thereof on the base substrate overlaps an orthogonal projection of the pixel definition layer on the base substrate, in order to avoid influences on the display effect when the OLED array substrate further comprises a pixel definition layer. Therefore, the touch sensor arranged in the display region A will not occlude the OLED device in the opening. For example, the orthogonal projection of the touch sensor on the base substrate can fall within the orthogonal projection of the pixel definition layer on the base substrate.

Specific arrangements in which the position of the touch sensor corresponds to the position of the pixel definition layer will be illustrated by examples when the first touch electrodes and the second touch electrodes in the touch sensor are arranged in different manners.

In an exemplary embodiment, the first touch electrodes 201 and the second touch electrodes 202 of the touch sensor 20 are arranged in a matrix, as shown in FIG. 2. I.e., the first touch electrodes 201 and the second touch electrodes 202 are arranged to intersect each other in different layers, and be insulated from each other via a dielectric layer 21 between the first touch electrodes 201 and the second touch electrodes 202.

Figure 7A:
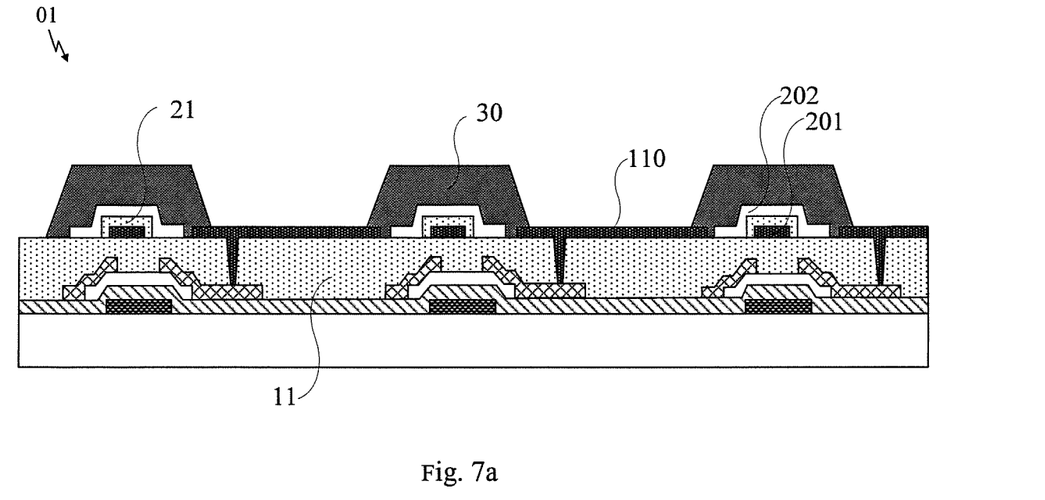
FIG. 7a schematically illustrates a top view showing that a touch sensor arranged in the manner of FIG. 2 corresponds to the pixel definition layer in position.
Figure 7B:
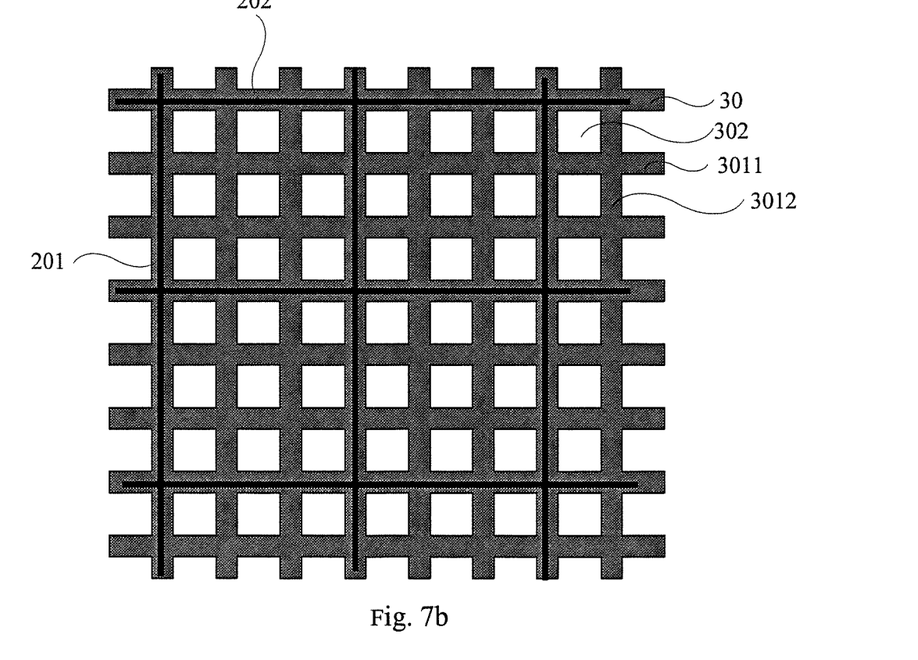
FIG. 7b schematically illustrates in a top view the respective relationships between projection positions of the first touch electrodes and the second touch electrodes in FIG. 7a and projection positions of pixel spacers.

In this case, as shown in FIG. 7a, the first touch electrodes 201 can be arranged in a same layer and made of a same material as the anode 110 of the OLED device. In other words, during the manufacture of anode 110, the first touch electrodes 201 can be manufactured simultaneously by one patterning process. Correspondingly, the second touch electrodes 202 can be manufactured by patterning another conductive material layer.

In this case, as shown in FIG. 7b, the pixel definition layer 30 comprises first portions 3011 extending in a longitudinal direction and second portions 3012 extending in a transversal direction, the first portions 3011 and the second portions 3012 enclosing openings 302. Orthogonal projections of the first touch electrodes 201 on the base substrate 101 can overlap orthogonal projections of the second portions 3012 on the base substrate, and orthogonal projections of the second touch electrodes 202 on the base substrate 101 can overlap orthogonal projections of the first portions 3011 on the base substrate 101. Obviously, projection positions of the first touch electrodes 201 and the second touch electrodes 202 can be interchanged.

It should be noted that, as used herein, the term of "patterning process" refers to processes for forming a predetermined pattern such as photolithography, photolithography and etching, printing, ink jetting and the like. As used herein, photolithography refers to a process that comprises steps such as film forming, exposure and developing, and forms patterns by using a photoresist, a mask, an exposure machine and so on. Corresponding patterning processes can be selected depending on the structure as formed in the present disclosure. In particular, the one patterning process refers to a process during which different exposure regions are formed by one mask process and then subjected to many removing processes such as etching and ashing, so as to obtain an expected pattern finally.

Figure 8:
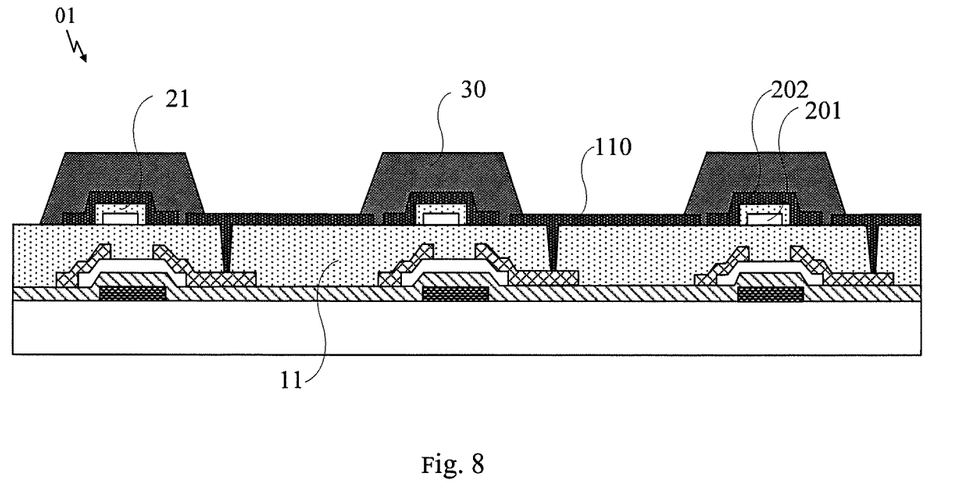
FIG. 8 schematically illustrates another top view showing that a touch sensor arranged in the manner of FIG. 2 corresponds to the pixel definition layer in position.

In another exemplary embodiment, as shown in FIG. 8, the second touch electrodes 202 can be arranged in a same layer and made of a same material as the anode 110 of the OLED device. In other words, during the manufacture of anode 110, the second touch electrodes 202 can be manufactured simultaneously by one patterning process. Correspondingly, the first touch electrodes 201 can be manufactured by patterning another conductive material layer.

It should be noted that in the case of FIG. 8, projection positions of the first touch electrodes 201 and the second touch electrodes 202 on the base substrate 101 are the same as those in the case of FIG. 7b, which will not be repeated for simplicity.

In yet another exemplary embodiment, the first touch electrodes 201 and the second touch electrodes 202 of the touch sensor 20 are arranged in a form of bridge, as shown in FIG. 3. I.e., the first touch electrodes 201 are arranged in a same layer as the block electrodes 2021 but insulated from them, and the block electrodes 2021 in a same row are electrically connected via bonding wires 22.

Figure 9A:
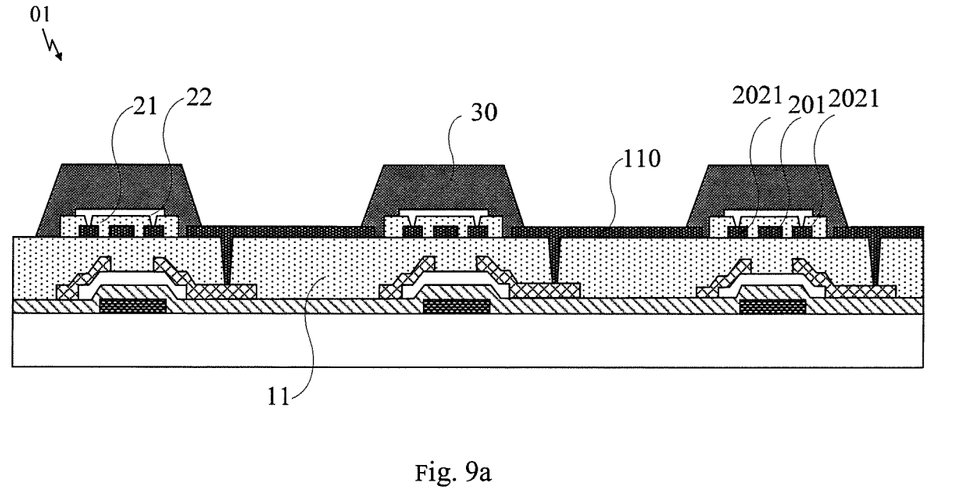
FIG. 9a schematically illustrates a top view showing that a touch sensor arranged in the manner of FIG. 3 corresponds to the pixel definition layer in position.

In this case, as shown by FIG. 9a, the first touch electrodes 201 and the block electrodes 2021 of the touch sensor 20 can be both arranged in a same layer and made of a same material as the anode 110 of the OLED device. In this way, during the manufacture of anode 110, the first touch electrodes 201 and the block electrodes 2021 can be manufactured simultaneously by one patterning process. Besides, the bonding wires 22 can be manufactured by patterning another conductive material layer.

Figure 9B:
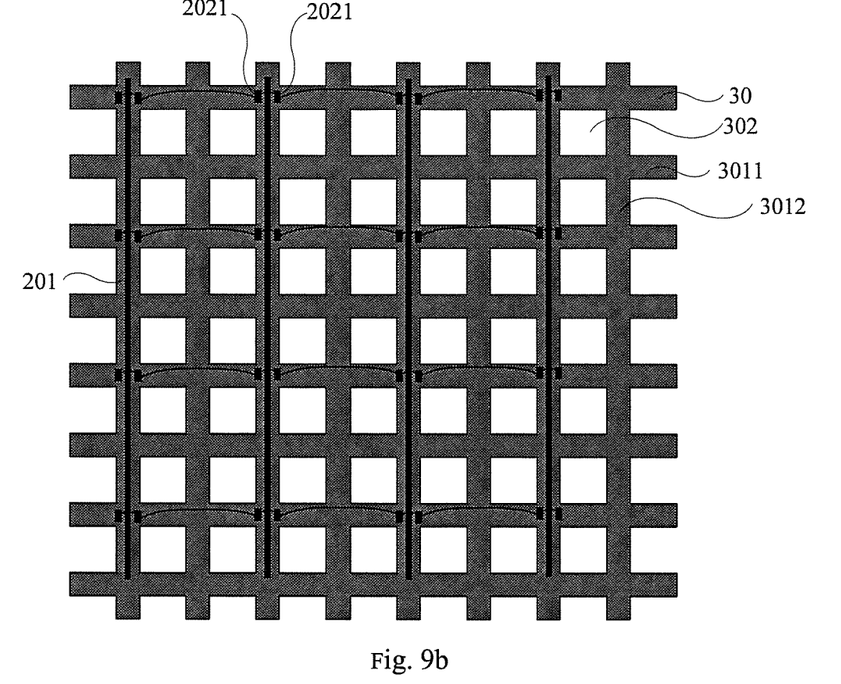
FIG. 9b schematically illustrates in a top view the respective relationships between projection positions of the first touch electrodes and the second touch electrodes in FIG. 9a and projection positions of pixel spacers.

Based on that, the first touch electrodes 201 and the second touch electrodes 202 of FIG. 9a are arranged in a form of bridge, as shown in FIG. 3. In this case, as shown in FIG. 9b, the pixel definition layer 30 comprises first portions 3011 extending in a longitudinal direction and second portions 3012 extending in a transversal direction, the first portions 3011 and the second portions 3012 enclosing openings 302. Orthogonal projections of the strip-shaped first touch electrodes 201 on the base substrate 101 can overlap orthogonal projections of the second portions 3012 on the base substrate 101. The block electrodes 2021 are located on respective sides of the strip-shaped first touch electrodes 201. Orthogonal projections of the bonding wires 22 on the base substrate 101 can overlap orthogonal projections of the first portions 3011 on the base substrate 101. For example, orthogonal projections of the bonding wires 22 on the base substrate 101 can fall within orthogonal projections of the first portions 3011 on the base substrate 101.

Figure 10:
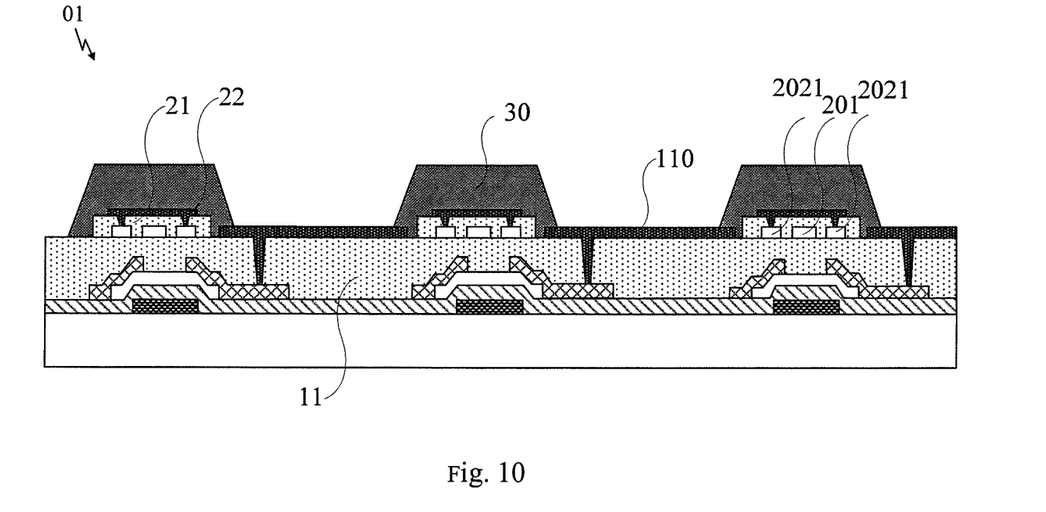
FIG. 10 schematically illustrates yet another top view showing that a touch sensor arranged in the manner of FIG. 3 corresponds to the pixel definition layer in position.

In another exemplary embodiment, as shown in FIG. 10, the bonding wires 22 can be arranged in a same layer and made of a same material as the anode 110 of the OLED device. In this case, during the manufacture of anode 110, the bonding wires 22 can be manufactured simultaneously by one patterning process. Besides, the first touch electrodes 201 and the block electrodes 2021 can be manufactured by patterning another conductive material layer.

It should be noted that in the case of FIG. 8, projection positions of the first touch electrodes 201 and the block electrodes 2021 on the base substrate 101 are the same as those in the case of FIG. 9b, which will not be repeated for simplicity.

In the above exemplary embodiments, the conductive material comprises but is not limited to Mo, Al, Cu, Ag, Ti, In—Sn—O (ITO), In—Zn—O (IZO), Al—Zn—O (AZO), graphene, carbon nanotubes and so on, or a composite material consisting of at least two of the above materials.

In the above exemplary embodiments, the orthogonal projection of the touch sensor 20 on the base substrate 101 overlaps the orthogonal projection of the pixel definition layer 30 on the base substrate 101, and the touch sensor 20 is located between the pixel definition layer 30 and the planarization layer 11. In this case, the manufacture of touch sensor 20 has been completed, when the OLED device comprising the anode 110 and the organic material function layer 120 as shown in FIG. 5 is manufactured in the openings 302 of the pixel definition layer 30. In this way, the manufacture of touch sensor 20 will not influence the manufacture of organic light emitting layer of the OLED device.

Embodiments of the present disclosure further provide a touch display device, comprising any OLED array substrate as mentioned above. The touch display device can achieve the same beneficial effects as the OLED array substrate provided by the above embodiments, which will not be repeated herein for simplicity.

Figure 11:
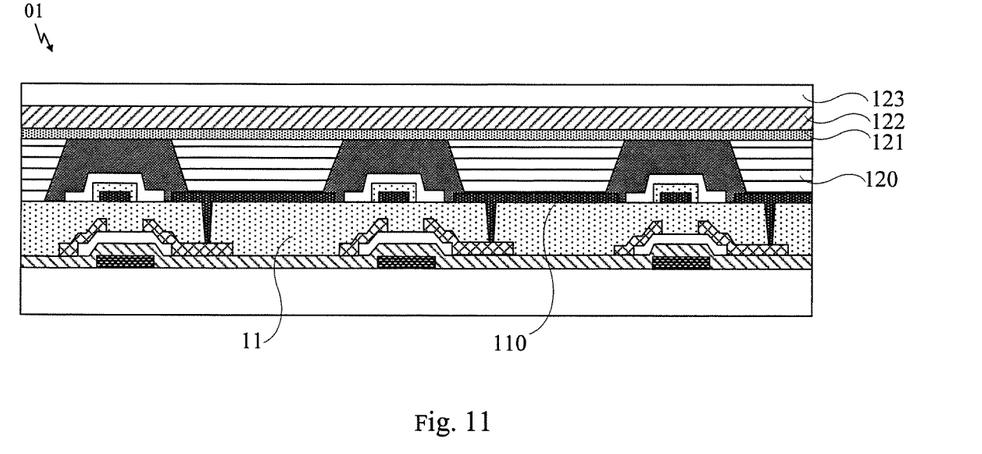
FIG. 11 is a schematic structure view of a touch display device provided by an embodiment of the present disclosure.

In particular, as shown in FIG. 11, the touch display device can further comprise an organic material function layer 120 in the openings 302, a cathode 121 on the pixel definition layer 30, a polarizer 122 on the cathode 121 and a thin film encapsulation layer or an encapsulation cover plate 123 on the polarizer 122.

In a further embodiments, the present disclosure provides a method for manufacturing an OLED array substrate.

Figure 12:
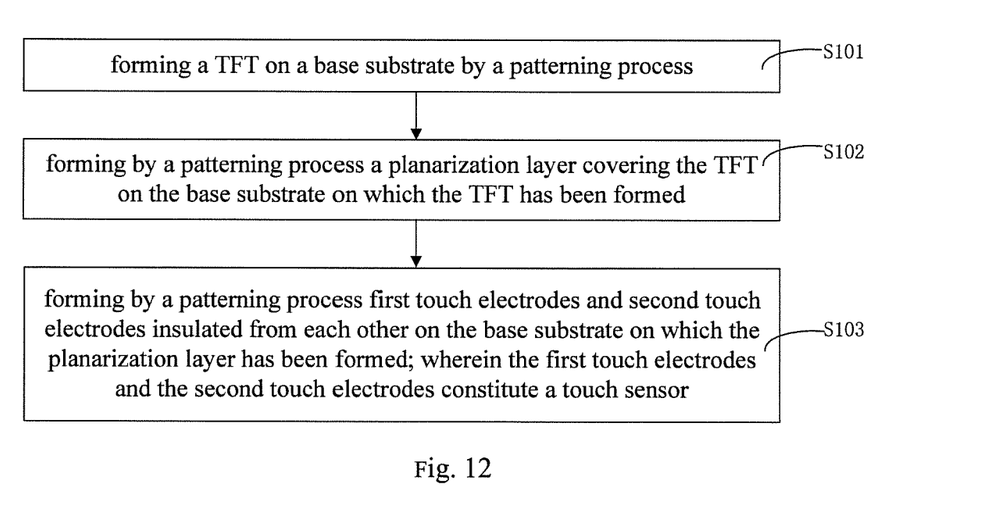
FIG. 12 is a flow chart of a method for manufacturing an OLED array substrate provided by an embodiment of the present disclosure.

As shown in FIG. 12, in step S101, a TFT is formed on a base substrate. In step S102, a planarization layer covering the TFT is formed on the base substrate on which the TFT has been formed.

It should be noted that in order that a source or a drain of the TFT can be connected with an anode of the OLED device, it is necessary to arrange via holes in the planarization layer 11 such that the anode can be connected with the source or the drain of the TFT through the via holes.

In step S103, first touch electrodes and second touch electrodes insulated from each other are formed on the base substrate on which the planarization layer has been formed. The first touch electrodes and the second touch electrodes constitute a touch sensor.

The method for manufacturing an OLED array substrate can achieve the same beneficial effects as the OLED array substrate provided in the above embodiments, which will not be repeated herein for simplicity.

Based on that, in order to avoid influences of the manufacture process of touch sensor on the manufacture of organic light emitting layer of the OLED device, in some exemplary embodiments, after the step S103, the method for manufacturing an OLED array substrate can further comprise forming a pixel definition layer 30 on the base substrate on which the touch sensor has been formed. In this way, after the manufacture of touch sensor has been completed, the organic material function layer of the OLED device is manufactured in the openings.

In view of above, when the touch sensor is arranged in the display region of the display device, in some exemplary embodiments, an orthogonal projection of the touch sensor on the base substrate can overlap an orthogonal projection of the pixel definition layer on the base substrate, as shown in FIGS. 7a-10, in order to avoid influences on the display effect.

The step S103 will be illustrated in detail by examples.

In an exemplary embodiment, the first touch electrodes 201 and the second touch electrodes 202 are arranged in a matrix, as shown in FIG. 2. I.e., the first touch electrodes 201 and the second touch electrodes 202 are arranged to intersect each other in different layers, and be insulated from each other via a dielectric layer 21 between the first touch electrodes 201 and the second touch electrodes 202. In this case, the step S103 can comprise firstly depositing a first conductive material layer on the base substrate 101 on which the planarization layer 11 has been formed, and then forming by one patterning process an anode 110 and strip-shaped first touch electrodes 201, as shown in FIG. 7a.

It should be noted that the conductive material for forming the conductive material layer is the same as described above, which will not be repeated herein for simplicity. When the first conductive material layer is mainly made of a metallic material, the patterns of anode 110 and strip-shaped first touch electrodes 201 can be obtained by a photolithography process, including steps of applying a photoresist, exposing, developing and etching. When the first conductive material layer is mainly made of nano silver, graphene, carbon nanotubes and so on, the patterns of anode 110 and strip-shaped first touch electrodes 201 can be prepared using liquid conductive solutions, such as silver nano paste, a graphene solution and a carbon nanotube solution, by ink-jet printing and screen printing for instance, and then subjected to UV curing and/or thermal curing.

Next, the step S103 further comprises forming a dielectric layer 21 on the base substrate 101 on which the first touch electrodes 201 have been formed.

It should be noted that the material for forming the dielectric layer 21 is the same as described above, which will not be repeated herein for simplicity. Specifically, when the material for forming the dielectric layer 21 comprises at least one of SiOx, SiNx, AlOx and SiOxNy, the pattern of dielectric layer 21 can be formed by a photolithography process, comprising steps of applying a photoresist, exposing, developing and etching. When the material for forming the dielectric layer 21 comprises an organic insulating material, the pattern of dielectric layer 21 can be formed using an organic insulating material solution by ink-jet printing and screen printing for instance, and then subjected to UV curing and/or thermal curing.

Next, the step S103 further comprises depositing a second conductive material layer on the base substrate 101 on which the dielectric layer 21 has been formed, and forming by a patterning process strip-shaped second touch electrodes 202 intersecting the first touch electrodes 201.

It should be noted that the material for forming the first conductive material layer and the material for forming the second conductive material layer can be the same, or different, which will not be limited in the present disclosure.

In an alternative embodiment, the step S103 can comprise firstly depositing a first conductive material layer on the base substrate 101 on which the planarization layer 11 has been formed, and forming strip-shaped first touch electrodes 201 as shown in FIG. 8 by a patterning process.

Next, the step S103 further comprises forming by a patterning process a dielectric layer 21 on the base substrate 101 on which the first touch electrodes 201 have been formed.

Next, the step S103 further comprises depositing a second conductive material layer on the base substrate 101 on which the dielectric layer 21 has been formed, and forming by one patterning process an anode 110 and strip-shaped second touch electrodes 202 intersecting the first touch electrodes 201.

In another exemplary embodiment, the first touch electrodes 201 and the second touch electrodes 202 are arranged in a form of bridge, as shown in FIG. 3. I.e., the first touch electrodes 201 are arranged in a same layer as the block electrodes 2021 but insulated from them, and the block electrodes 2021 in a same row are electrically connected via bonding wires 22. In this case, the step S103 can comprise firstly depositing a first conductive material layer on the base substrate 101 on which the planarization layer 11 has been formed, and then forming by one patterning process strip-shaped first touch electrodes 201 as shown in FIG. 9a, block electrodes 2021 arranged in a matrix between the strip-shaped first touch electrodes 201 as well as an anode 110, wherein the first touch electrodes 201 extend in a longitudinal direction.

Next, the step S103 further comprises forming a dielectric layer 21 on the base substrate on which the first touch electrodes 201 and the block electrodes 2021 have been formed, and forming via holes in positions of the dielectric layer 21 corresponding to the block electrodes 2021.

Next, the step S103 further comprises depositing a second conductive material layer on the base substrate 101 on which the dielectric layer 21 has been formed and forming by a patterning process bonding wires 22. As shown in FIG. 3, the bonding wires 22 are electrically connected with the block electrodes 2021 through the via holes in a transversal direction, and the bonding wires 22 and the block electrodes 2021 constitute second touch electrodes.

In an alternative exemplary embodiment, the step S103 can comprise firstly depositing a first conductive material layer on the base substrate on which the planarization layer 11 has been formed, and forming by one patterning process strip-shaped first touch electrodes 201 as shown in FIG. 10 and block electrodes 2021 arranged in a matrix between the strip-shaped first touch electrodes 201. The first touch electrodes 201 extend in a longitudinal direction.

Next, the step S103 comprises forming a dielectric layer 21 on the base substrate 101 on which the first touch electrodes 201 and the block electrodes 2021 have been formed, and forming via holes in positions of the dielectric layer 21 corresponding to the block electrodes 202, as shown in FIG. 10.

Next, the step S103 further comprises depositing a second conductive material layer on the base substrate on which the dielectric layer 21 has been formed, and forming by one patterning process bonding wires 22 and an anode 110. As shown in FIG. 3, the bonding wires 22 are electrically connected with the block electrodes 2021 through the via holes in a transversal direction, and the bonding wires 22 and the block electrodes 2021 constitute second touch electrodes.

Based on that, after the manufacture of OLED array substrate according to any of FIGS. 7a-10 using the above scheme, an organic material function layer 120 as shown in FIG. 11 located in the opening 302, a cathode 121 of the OLED device, a polarizer 122, and a thin film encapsulating layer or an encapsulation cover plate 123 can be manufactured sequentially on the base substrate 101 on which the pixel definition layer 30 has been formed, thereby obtaining a touch display device.

In particular, the touch display device can further comprise a gap control layer on a side of the pixel definition layer 30 facing away from the base substrate 101, the gap control layer having a support function such that the display side of the touch display device is flush.

The descriptions above are only specific embodiments of the present disclosure, but the protection scope of the present disclosure shall not be limited thereto. Any variation or substitution easily conceivable within the technical range disclosed by the present disclosure for a skilled person, who is familiar with this technical field, shall fall within the protection scope of the present disclosure. Therefore, the protection scope of the present disclosure shall be subject to the protection scope of the claims.

What is claimed is:

1. An Organic Light-Emitting Diode (OLED) array substrate, comprising:
    a base substrate;
    a transistor comprising a source electrode and a drain electrode on the base substrate;
    a planarization layer on the base substrate and covering the transistor;
    a touch sensor on a side of the planarization layer facing away from the base substrate; and
    a pixel definition layer on a side of the planarization layer facing away from the transistor and comprising a plurality of openings,
    wherein the touch sensor comprises first touch electrodes and second touch electrodes insulated from each other,
    wherein the touch sensor is between the pixel definition layer and the planarization layer, and an orthogonal projection of the touch sensor on the base substrate overlaps an orthogonal projection of the pixel definition layer on the base substrate,
    wherein the first touch electrodes extend in a first direction, the second touch electrodes extend in a second direction, and the first direction is perpendicular to the second direction,
    wherein sides of the first touch electrodes extending in the first direction on an upper surface of the first touch electrodes facing away from the base substrate are inwardly recessed, outwardly protruding, or in a shape of sawteeth;
    wherein sides of the second touch electrodes extending in the second direction on an upper surface of the second touch electrodes facing away from the base substrate are inwardly recessed, outwardly protruding, or in a shape of sawteeth;
    wherein the touch sensor further comprises a dielectric layer, by which the first touch electrodes and the second touch electrodes are insulated from each other;
    wherein the first touch electrodes are strip electrodes extending in the first direction, and the second touch electrodes comprise block electrodes arranged in a matrix between the strip electrodes of the first touch electrodes and bonding wires electrically connected to adjacent block electrodes in the second direction;
    wherein the first touch electrodes and the block electrodes are located in a same layer, and the bonding wires are located in a different layer from the first touch electrodes and the block electrodes, and
    wherein sides of the block electrodes extending in the second direction on the upper surface of the block electrodes facing away from the base substrate are inwardly recessed, outwardly protruding or in a shape of sawteeth.

2. The OLED array substrate according to claim 1, further comprising an anode on a side of the planarization layer facing away from the base substrate, wherein the first touch electrodes and the second touch electrodes are arranged in a same layer and made of a same material as the anode.

3. The OLED array substrate according to claim 2, wherein the pixel definition layer comprises first portions extending in the first direction and second portions extending in the second direction, the first portions and the second portions enclosing the plurality of openings, wherein
    orthogonal projections of the bonding wires on the base substrate overlap orthogonal projections of the second portions on the base substrate.

4. The OLED array substrate according to claim 1, further comprising an anode on a side of the planarization layer facing away from the base substrate, wherein the bonding wires are arranged in a same layer and made of a same material as the anode.

5. A touch display device, comprising the OLED array substrate according to claim 1.

6. The touch display device according to claim 5, further comprising a flexible encapsulation layer for encapsulating the OLED array substrate.

7. A method for manufacturing an OLED array substrate, comprising:

forming a transistor comprising a source electrode and a drain electrode on a base substrate;

forming a planarization layer covering the transistor on the base substrate on which the transistor has been formed;

forming first touch electrodes and second touch electrodes insulated from each other on the base substrate on which the planarization layer has been formed, and forming a pixel definition layer on the base substrate on which the first touch electrodes and the second touch electrodes have been formed, the pixel definition layer comprising a plurality of openings, wherein the first touch electrodes and the second touch electrodes constitute a touch sensor, wherein an orthogonal projection of the touch sensor on the base substrate overlaps an orthogonal projection of the pixel definition layer on the base substrate, wherein the first touch electrodes extend in a first direction, the second touch electrodes extend in a second direction, and the first direction is perpendicular to the second direction, wherein sides of the first touch electrodes extending in the first direction on an upper surface of the first touch electrodes facing away from the base substrate are inwardly recessed, outwardly protruding, or in a shape of sawteeth;

wherein sides of the second touch electrodes extending in the second direction on an upper surface of the second touch electrodes facing away from the base substrate are inwardly recessed, outwardly protruding, or in a shape of sawteeth;

wherein the touch sensor further comprises a dielectric layer, by which the first touch electrodes and the second touch electrodes are insulated from each other;

wherein the first touch electrodes are strip electrodes extending in the first direction, and the second touch electrodes comprise block electrodes arranged in a matrix between the strip electrodes of the first touch electrodes and bonding wires electrically connected to adjacent block electrodes in the second direction;

wherein the first touch electrodes and the block electrodes are located in a same layer, and the bonding wires are located in a different layer from the first touch electrodes and the block electrodes, and wherein sides of the block electrodes extending in the second direction on the upper surface of the block electrodes facing away from the base substrate are inwardly recessed, outwardly protruding or in a shape of sawteeth.

8. The method for manufacturing the OLED array substrate according to claim 7, wherein forming the first touch electrodes and the second touch electrodes insulated from each other comprises:

depositing a first conductive material layer on the base substrate on which the planarization layer has been formed, and forming by one patterning process strip-shaped first touch electrodes, the block electrodes arranged in a matrix between the strip-shaped first touch electrodes as well as an anode;

forming the dielectric layer on the base substrate on which the first touch electrodes, the block electrodes and the anode have been formed, and forming via holes in positions of the dielectric layer corresponding to the block electrodes;

depositing a second conductive material layer on the base substrate on which the dielectric layer has been formed, and forming the bonding wires by a patterning process, wherein the bonding wires are electrically connected to the block electrodes through the via holes in the second direction, and wherein the bonding wires and the block electrodes constitute the second touch electrodes.

9. The method for manufacturing the OLED array substrate according to claim 7, wherein forming the first touch electrodes and the second touch electrodes insulated from each other comprises:

depositing a first conductive material layer on the base substrate on which the planarization layer has been formed, and forming by one patterning process strip-shaped first touch electrodes and the block electrodes arranged in a matrix between the strip-shaped first touch electrodes;

forming the dielectric layer on the base substrate on which the first touch electrodes and the block electrodes have been formed, and forming via holes in positions of the dielectric layer corresponding to the block electrodes; and depositing a second conductive material layer on the base substrate on which the dielectric layer has been formed, and forming by one patterning process bonding wires and an anode, wherein the bonding wires are electrically connected with the block electrodes through the via holes in the second direction, and wherein the bonding wires and the block electrodes constitute the second touch electrodes.

* * * * *